United States Patent [19]

Lai

[11] Patent Number: 5,416,749

[45] Date of Patent: May 16, 1995

[54] DATA RETRIEVAL FROM SEQUENTIAL-ACCESS MEMORY DEVICE

[75] Inventor: Kenny K. Lai, San Jose, Calif.

[73] Assignee: S3, Incorporated, Santa Clara, Calif.

[21] Appl. No.: 165,035

[22] Filed: Dec. 10, 1993

[51] Int. Cl.6 ............................................. G11C 8/00
[52] U.S. Cl. ............................ 365/240; 365/230.02; 365/230.04; 365/233; 365/239
[58] Field of Search ............ 365/240, 239, 230.04, 365/230.02, 189.02, 233

[56] References Cited

U.S. PATENT DOCUMENTS

| | | | |
|---|---|---|---|
| 5,253,213 | 10/1993 | Matsumura et al. | 365/240 X |
| 5,261,064 | 11/1993 | Wyland | 365/230.04 X |
| 5,305,281 | 4/1994 | Lubeck | 365/230.04 |
| 5,311,468 | 5/1994 | Anderson | 365/240 X |

*Primary Examiner*—Do Hyun Yoo
*Attorney, Agent, or Firm*—Dennis S. Fernandez; Edward B. Weller; Fenwick & West

[57] ABSTRACT

In a sequential-access memory device having storage registers located at consecutively addressable rows, data are accessed from odd and even banks by enabling consecutive rows during a common read cycle. In particular, by coupling data lines separately to odd and even register rows in the memory device, data may be accessed selectably from consecutive register rows with reduced access time.

19 Claims, 8 Drawing Sheets

DATA RETRIEVAL FROM SEQUENTIAL-ACCESS MEMORY DEVICE

BACKGROUND OF THE INVENTION

1. Field of the Invention

The invention relates to electronic circuits, particularly to an improved technique for retrieving data from sequential-access memory devices.

2. Description of Background Art

In the area of electronic circuit design, various memory devices are used for storing digital data. Data stored in conventional memory devices are accessible either randomly (i.e., from various storage locations in the memory device, which are not necessarily sequentially located) or sequentially (i.e., from consecutive, neighboring storage locations).

Generally, faster access times are achievable from sequential access-type devices rather than from random access-type devices, particularly when data are read from sequential storage locations. However, as system performance requirements continue to increase, there is a need to provide faster techniques for retrieving data from sequential-access memory devices.

SUMMARY OF THE INVENTION

The invention resides in a sequential-access memory device having storage cells located at consecutively addressable rows, wherein data retrieval is achieved by enabling consecutive rows during a given cycle and selecting an enabled row using a multiplexer coupled to such rows over separate data lines provided in the memory device.

Preferably, a flip-flop, which is toggled by read and clock signals, applies a select signal to the multiplexer to select a particular data line. Alternately, the multiplexer may receive the select signal from an exclusive-OR circuit, which receives read and count signals to generate the select signal. In this way, a flip flop may receive a data signal generated by the multiplexer.

DETAILED DESCRIPTION OF THE PREFERRED EMBODIMENTS

Figure 1:
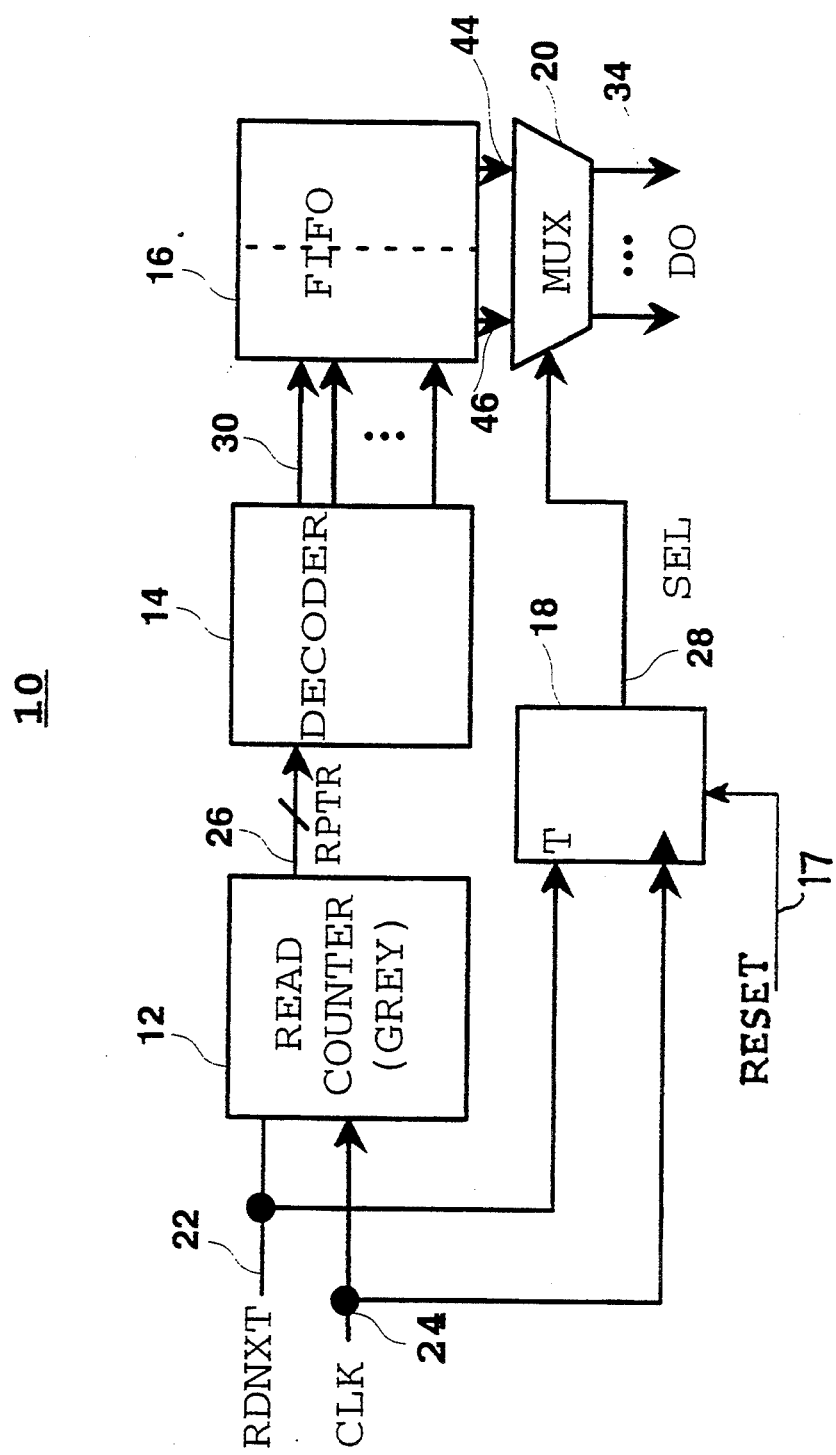
FIG. 1 is a generalized block diagram of electronic storage system 10, including storage circuit 16 and selector circuit 12, 14, 18, 20, according to the present invention.

FIG. 1 shows generally a block diagram of electronic storage system 10, which is a preferred embodiment of the present invention. System 10 includes select circuit portion (read counter 12, decoder 14, toggle flip flop 18, and multiplexer 20) and storage circuit portion (first-in/first-out (FIFO) circuit 16).

Preferably, the storage circuit portion may be any electronic storage or memory device or combined circuitry, such as a FIFO circuit or "burst-mode" memory device, having multiple digital cells or storage registers that are accessible or readable at sequential or consecutive address locations in such circuit 16.

Thus, for example, in a preferred FIFO implementation, output data signals 44, 46 representative of data stored in sequential address or row locations are generated from FIFO circuit 16 by applying thereto corresponding addressing signals 30 to read from such sequential locations.

To provide sequential addressing signals 30, read counter 12 and decoder 14 are coupled to FIFO circuit 16. In particular, read or read-next ("RDNXT") signal 22, clock signal 24, and reset signal 17 are applied, possibly from an external, synchronous processor (not shown), to read counter 12. In response to signals 22, 24, read counter 12 generates digitally cyclic, incrementing or decrementing count or read pointer ("RPTR") signal(s) 26, preferably according to a conventional "Grey Code" or similar signal generation algorithm. Decoder 14 then receives and conventionally decodes RPTR signals 26 to apply addressing signal 30 to FIFO circuit 16, preferably at sequentially incrementing or decrementing row address locations.

In accordance with the present invention, multiplexer 20 is coupled 44, 46 to FIFO circuit 16 to access data registers therein and thereby generate selectably 28 output data signal(s) (DO) 34. To cause multiplexer 20 to select particular data lines 44, 46 in FIFO circuit 16, toggle flip flop 18 receives RDNXT signal 22 and CLK signal 24 to generate select signal (SEL) 28, which is applicable to multiplexer 20.

Figure 2:
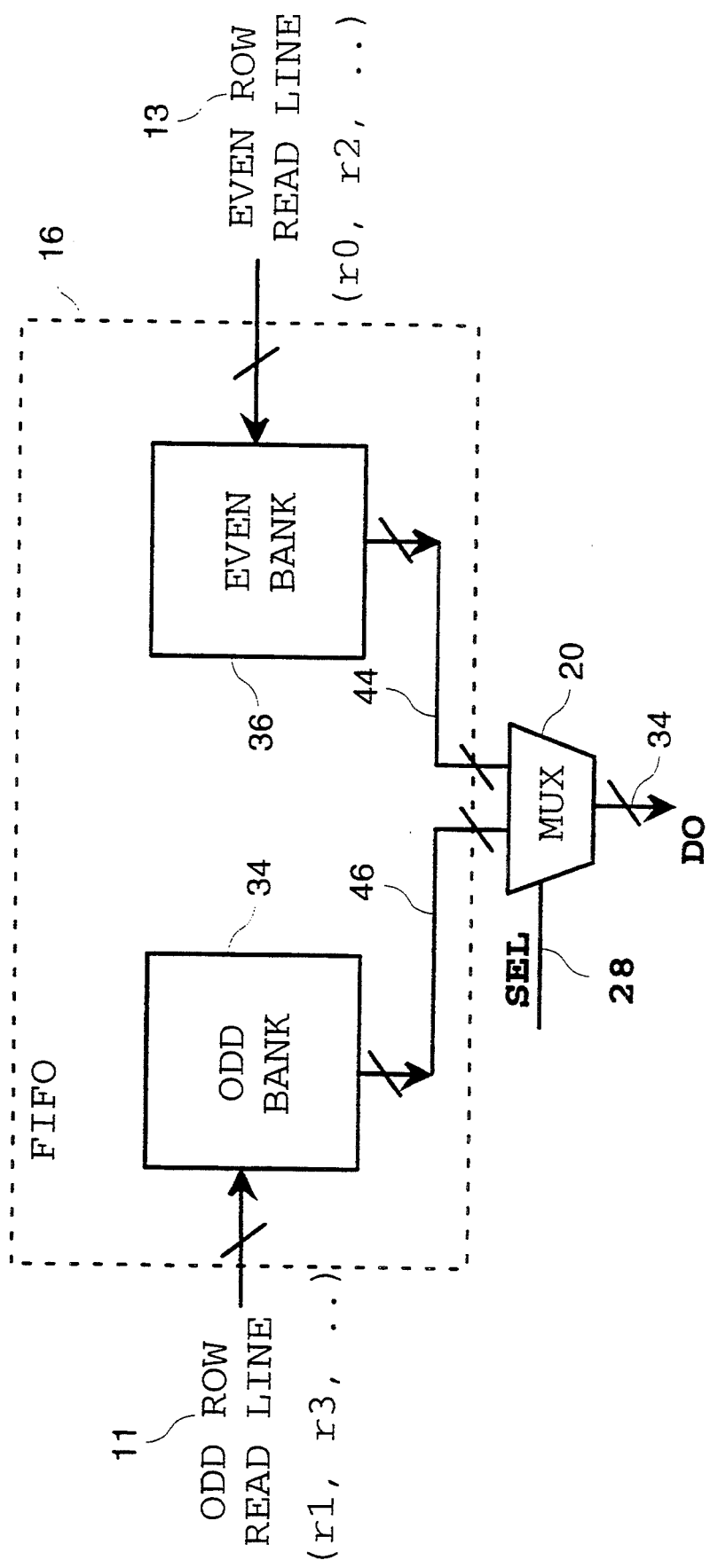
FIGS. 2 and 3 are simplified diagrams illustrating inventive aspects of electronic storage system 10 of FIG. 1.
Figure 3:
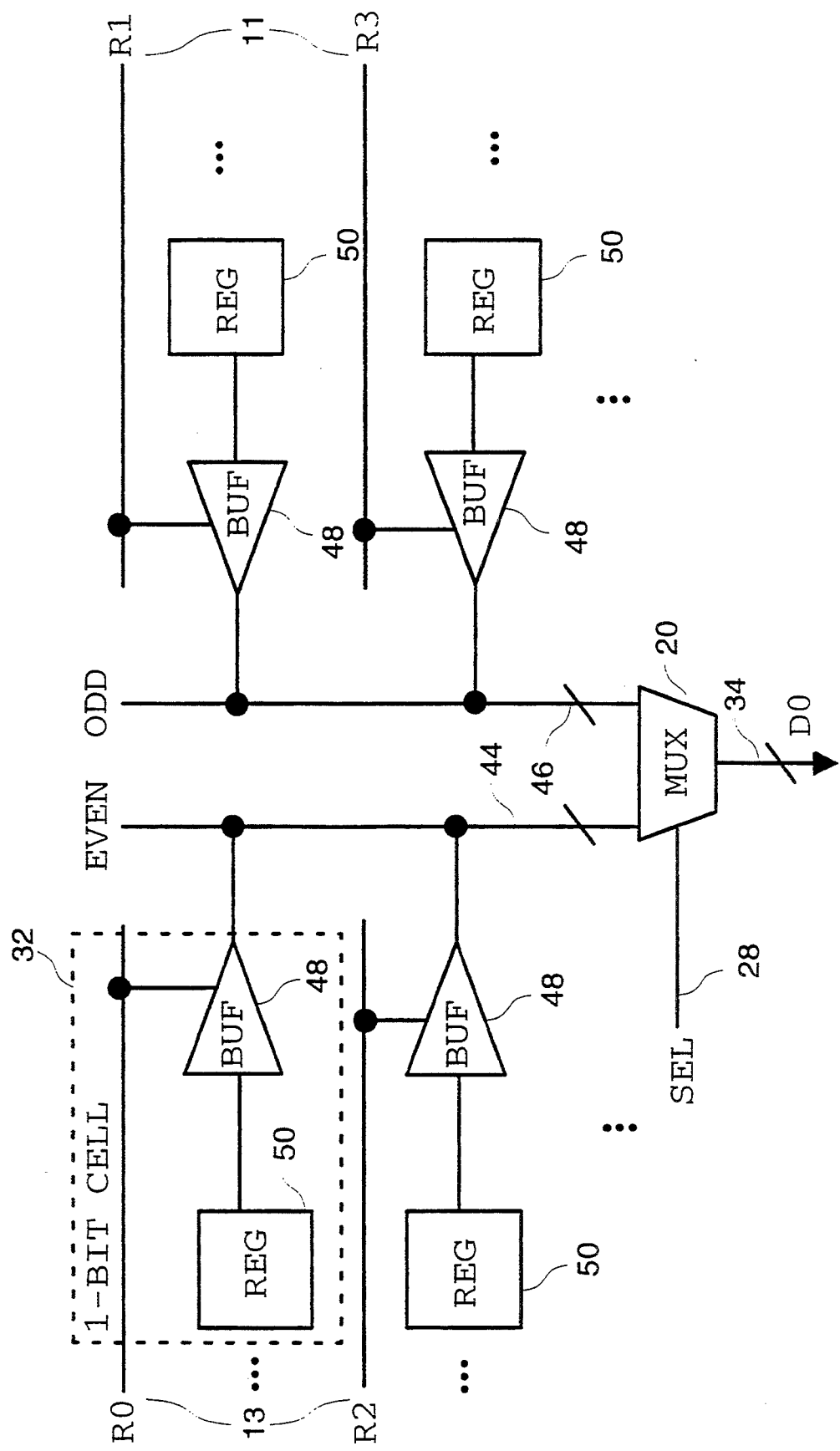

FIGS. 2 and 3 are simplified schematic/block diagrams which illustrate electrical coupling between multiplexer 20 and data lines 44, 46 in FIFO circuit 16. In FIG. 2, FIFO circuit 16 is shown having a pair of storage banks 34, 36 coupled 44, 46 to multiplexer 20, which generates data signal 34. In particular, banks 34, 36 are assembled as being either odd or even, such that odd bank 34 includes registers accessible from "odd" data line 46 when certain odd row address read lines 11 (e.g., R1, R3, etc.) are enabled 30 by decoder 14, and even bank 36 similarly includes registers accessible from "even" data line 44 when certain even row address read lines 13 (e.g., R0, R2, etc.) are enabled 30 by decoder 14.

In FIG. 3, FIFO circuit 16 is shown in additional detail coupled to multiplexer 20 over even, odd data lines 44, 46. FIFO 16 includes multiple single data-bit storage cells 32, each cell having storage register 50 coupled to tri-statable buffer 48 located at particular row addresses. Each buffer 48 may be enabled or de-tristated effectively by addressing signal 30 provided by decoder 14 and received by FIFO circuit 16 as odd-/even read line signals 11, 13 to allow digital data stored in selected registers 50 to be accessible by multiplexer through even/odd data lines 44, 46 coupled respectively to buffers 48 located at even/odd row addresses.

Thus, in accordance with the present invention, data may be accessed from FIFO circuit 16 by enabling simultaneously, during a read or access cycle, two or more consecutive rows (i.e., an odd row and a neighboring even row) in FIFO circuit 16, such that, for example, datum from register 50 located at enabled row R0 is accessible through even data line 44, and, at the same time, datum from register 50 located at enabled row R1 is accessible through odd data line 46.

In this interleaved manner, either even or odd data line 44, 46 may be selected 28 by multiplexer 20 to provide data signal 34. Data access time is improved significantly because data from "current" and corresponding "next" rows are stabilized and selectable immediately, without incurring access delays associated with read counter 12 or decoder 14. This performance improvement is achieved merely by activating RDNXT, CLK signals 22, 24, thereby causing flip flop 18 to toggle SEL signal 28 synchronously.

In an "asynchronous," clock-less implementation, flip flop 18 may be toggled by a single asynchronous control signal, which functions equivalently to a logical-AND of RDNXT, CLK signals 22, 24. Also note that because read counter 12 generates RPTR signal 26 for sequential row addressing, preferably according to Grey code, signal contention arising from multiplexer 20 attempting to access non-sequential row addresses or the same row addresses is functionally impossible.

Figure 4:
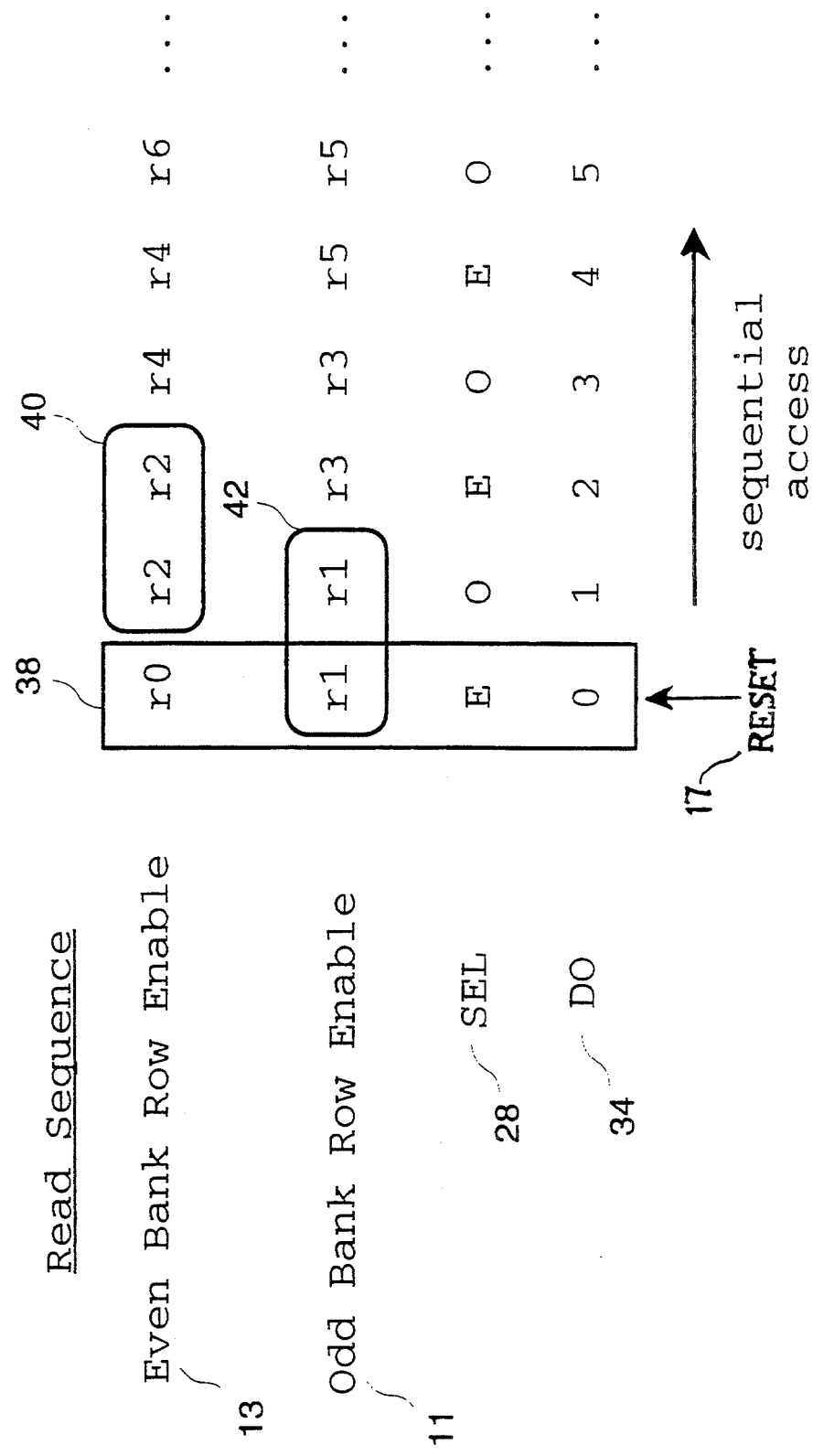
FIG. 4 is a table showing representative read sequence signaling.
Figure 5:
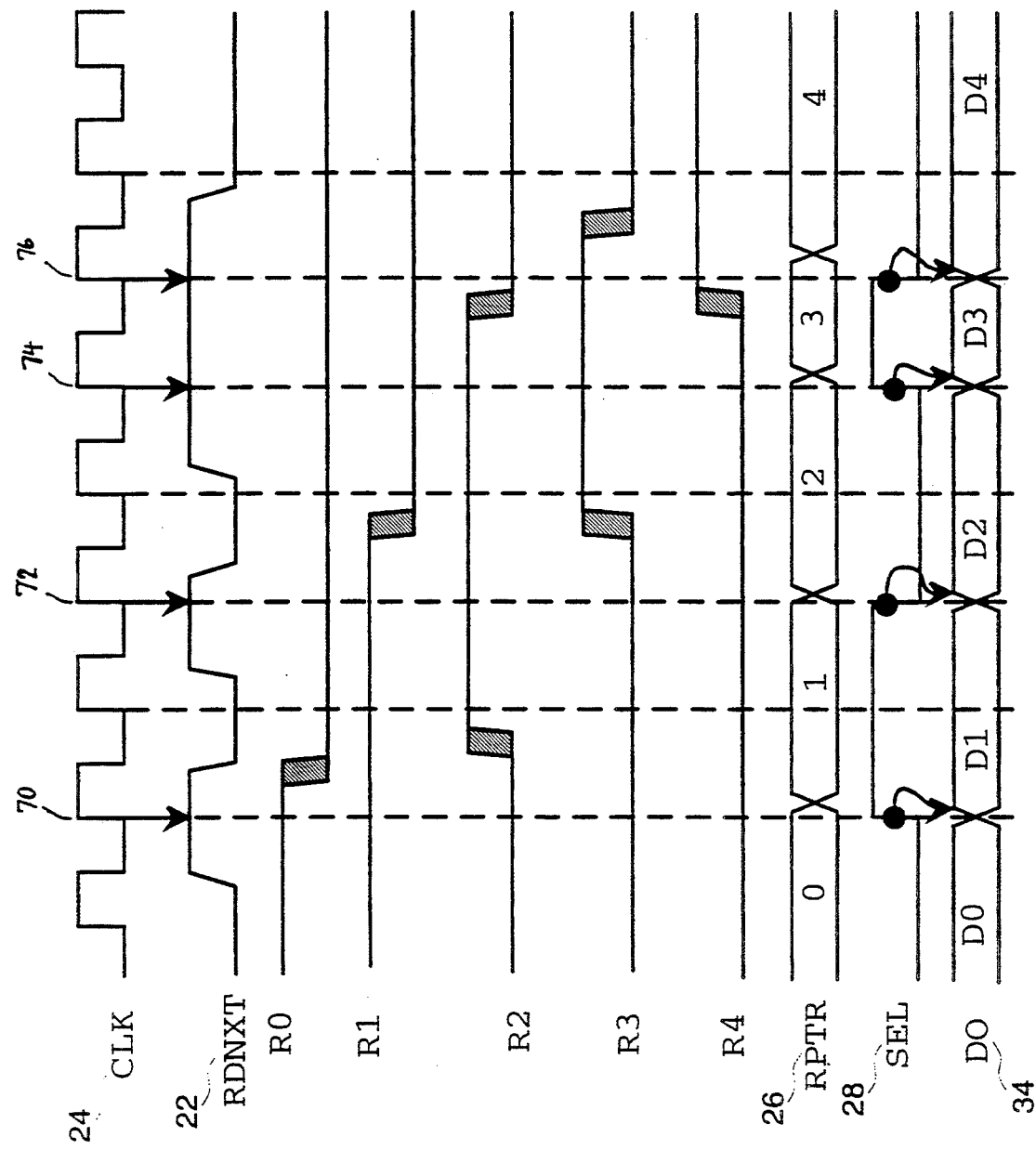
FIG. 5 is a representative timing diagram illustrating operation of electronic storage system 10.

In FIGS. 4 and 5, representative read operation of the inventive storage system is illustrated. FIG. 4 shows read sequence signaling for activating row address lines to enable rows 11, 13 in even and odd banks, as well as status of SEL and DO signals 28, 34.

Initially, reset state 38 is defined by applying reset signal 17 to flip flop 18. In this way, low (i.e., "0") SEL signal 28 is generated, such that even data lines 44 are selected initially by multiplexer 20. Additionally, during reset state 38, read lines 13, 11 are set by decoder 14 through addressing lines 30 to read from even row address "R0" (the current row) and odd row address "R1" (the next row), thereby enabling addressed even and odd buffers 48 respectively to cause corresponding registers 50 to be accessible to multiplexer 20 through even and odd data lines 44, 46 respectively. Thus, when reset signal 17 is applied to flip flop 18, low SEL signal 28 is applied to multiplexer 20 to select even ("E") data line 44 and thereby generate "0" as data signal 34.

During a subsequent read cycle, SEL signal 28 is toggled to cause multiplexer 20 to select odd ("O") data line 46. At this time, even bank row enable 13 is shifted incrementally to a subsequent even row "R2", which serves as the next row 40 for reading, while previous next row "R1" now becomes the current row 42 for reading. Thus, because multiplexer 20 selects odd data line 46, "1" is generated as data signal 34.

As shown for subsequent read cycles, while SEL signal 28 is toggled (e.g., from even to odd to even, etc.,) even and odd read lines 13, 11 are updated incrementally such that at any given read cycle, a current row address or a next, neighboring row address is selectable quickly by multiplexer 20 to generate data signal 34 therefrom.

In FIG. 5, a timing diagram shows representative operation of system 10 through various digital signal transitions, including CLK signal 24, RDNXT signal 22, row address lines R0-R4, RPTR signal 26, SEL signal 28, and data signal 34. As shown, CLK signal 24 is a regular digital pulse, which when received (at rising CLK edge) in combination with RDNXT signal (high) 22 by read counter 12 and by toggle flip flop 18 causes RPTR signal 26 and SEL signal 28 to be generated respectively.

Thus, as shown during first instance 70 when CLK edge rises and RDNXT signal 22 is high, next (R1) and subsequent next (R2) row addresses are enabled according to RPTR signal 26 applied by decoder 14 to FIFO circuit 16, and SEL signal 28 toggles high to cause data signal 34 to be generated by multiplexer 20 by accessing register 50 from row address R0, where buffer 48 is enabled to couple such register 50 to multiplexer 20 through even data line 44.

In next instance 72, when current row is now assigned to R1, and R2 becomes the next row for reading, according to incremented RPTR signal 26, SEL signal 28 toggles low, thereby causing multiplexer 20 to access data from register 50 in row address R1, when buffer 48 in such row R1 is enabled to couple multiplexer 20 to such register 50 through odd data line 46.

In subsequent instances 74, 76, SEL signal 28 is toggled again and data from consecutive row addresses R2, R3, etc. are accessed, as described herein according to the present invention.

Figure 6:
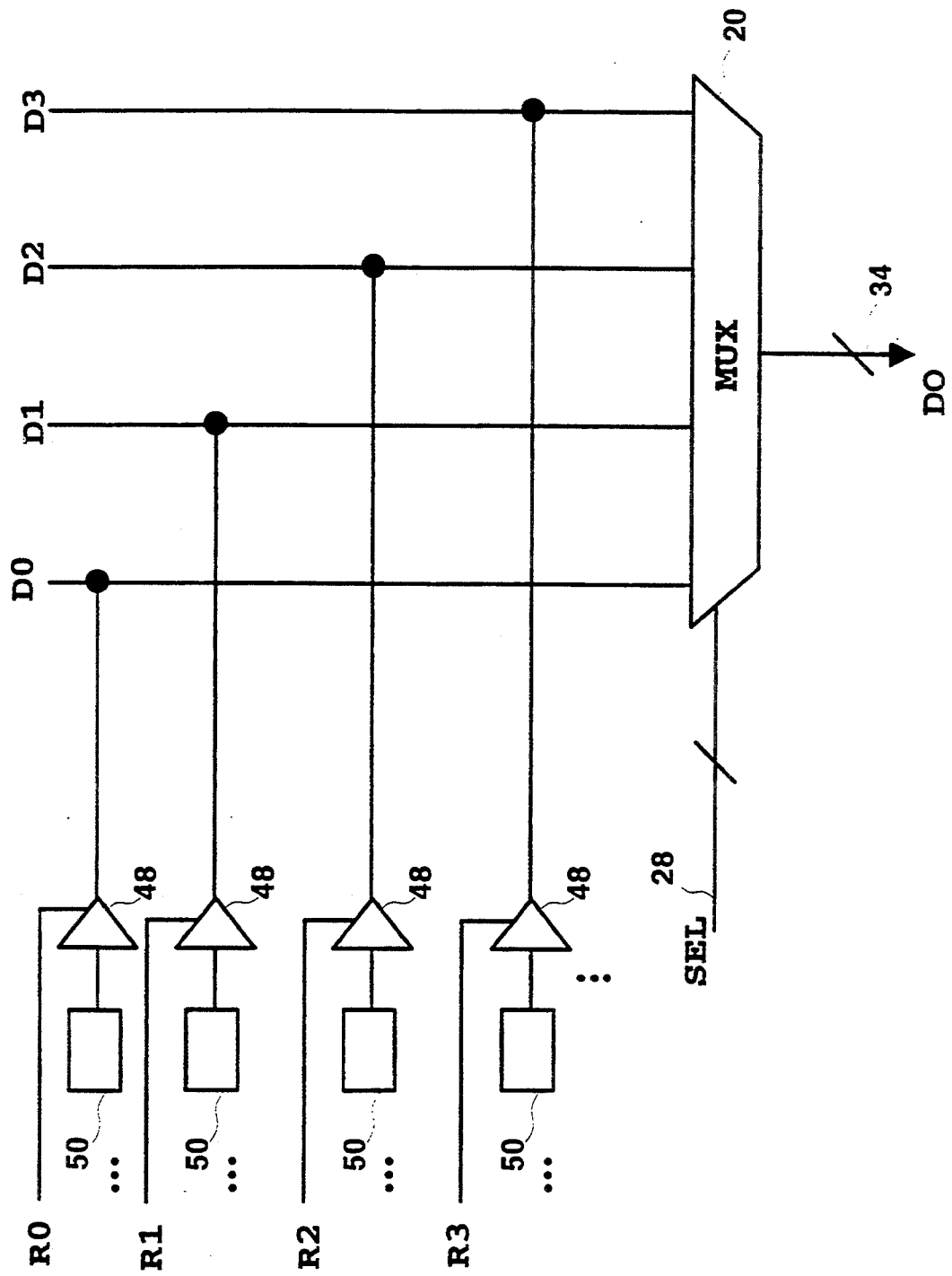
FIGS. 6 and 7 are schematic diagrams of alternate circuits for accessing data from storage circuit 16, according to the present invention.

In an alternate embodiment of the present invention shown in FIG. 6, data lines D2, D3 additional to data lines D0, D1 are included in FIFO circuit 16 and couple multiplexer 20 to additional banks or sets of digital storage cells having register 50 connectable to corresponding data lines D0-D3 by enabling corresponding tri-statable buffers 48 coupled thereto.

In this multiple data-line implementation, similarly to the invention for data access described in the preferred embodiment, a current row address is defined in a given read cycle; but a first subsequent row address, a second subsequent row address, and a third subsequent row address are also defined, wherein each of such four row addresses are addressable consecutively, preferably according to the Grey-code technique used by read counter 12 described herein to generate RPTR signal 26 for causing decoder 14 to apply addressing signals 30 to FIFO circuit 16.

Additionally, in this implementation, multiple selection lines 28 are generated preferably by multiple flip flops coupled to RDNXT signal 22 and CLK signal 24 and arranged to generate selection signals which cause multiplexer 20 to toggle or select sequentially during each read cycle from each "next" data line (e.g., first cycle: select D0, second cycle: select D1, third cycle: select D2, etc.). Thus, four (or more) banks of storage cells are made available in a given read cycle to multiplexer 20, according to the present invention, such that access time is reduced significantly.

Figure 7:
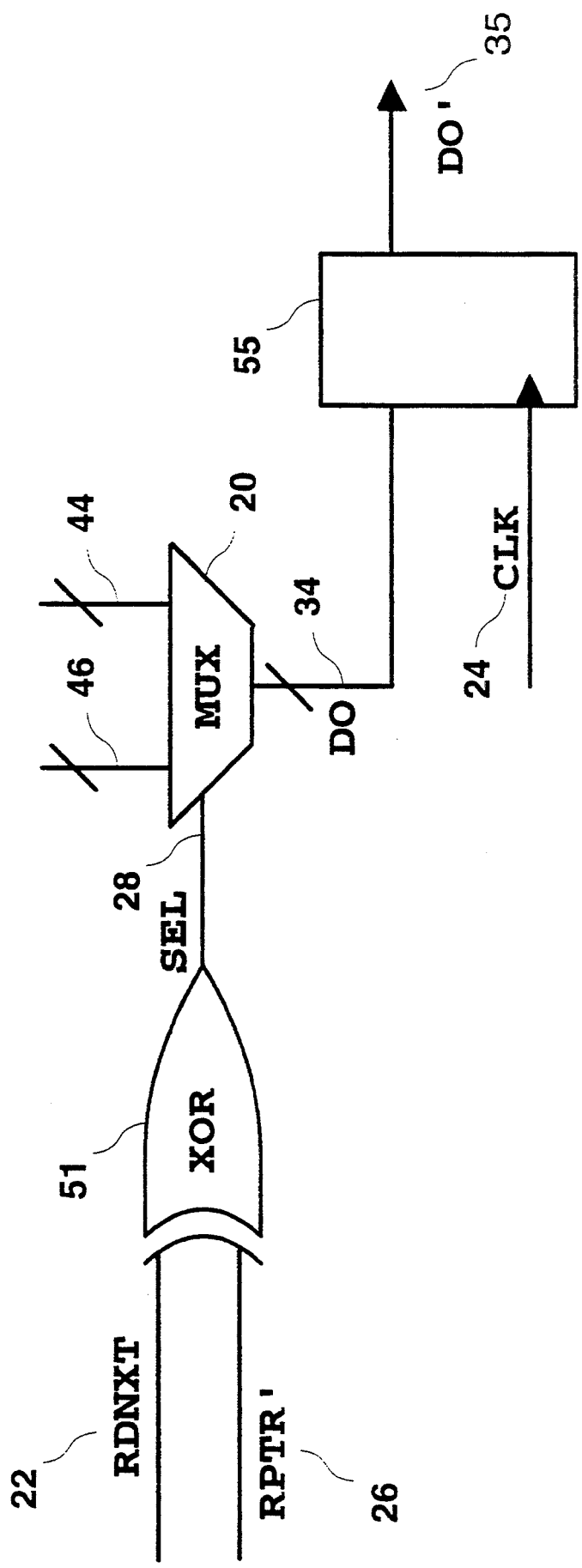

In another alternate embodiment of the present invention shown in FIG. 7, data access from FIFO circuit 16 is enabled by providing an exclusive-OR circuit 51, which receives RDNXT signal 22 and RPTR' signal 26 to generate and apply SEL signal 28 to multiplexer 20, which also receives data lines 44, 46 and generates data signal 34. Also in this embodiment, flip flop 55 is provided which is toggled by data signal 34 and clocked by CLK signal 24 to generate output signal (DO') 35.

Figure 8:
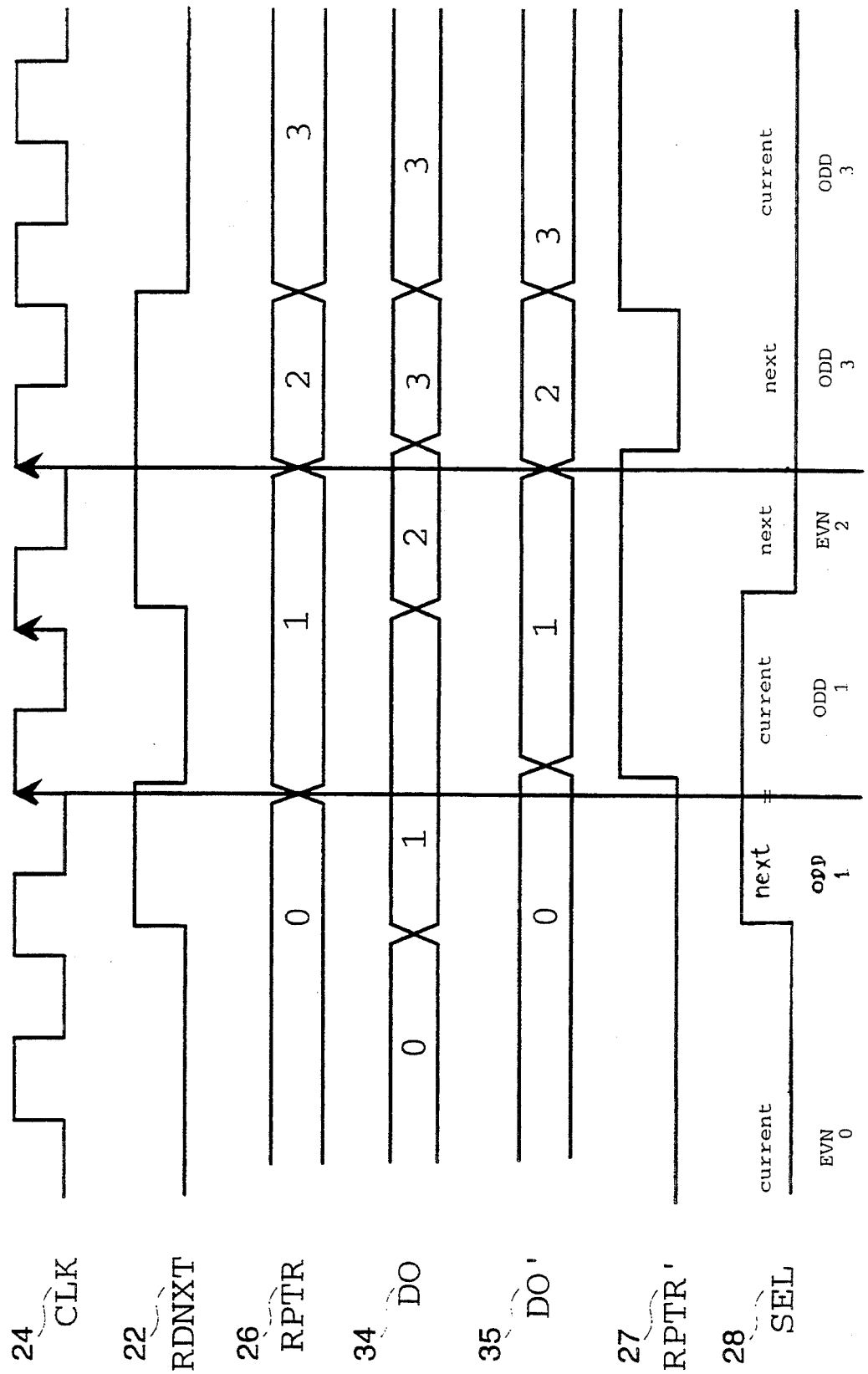
FIG. 8 is a representative timing diagram illustrating operation of storage circuit 16 using alternate circuit of FIG. 7.

FIG. 8 shows a timing diagram of representative signals for operating the alternate embodiment of FIG. 7, showing in particular various digital transitions of CLK signal 24, RDNXT signal 22, RPTR signal 26, data signal 34, output signal 35, RPTR' signal 27, and SEL signal 28. In this alternate embodiment, SEL signal 28 is generated, similarly as in other embodiments described herein, for causing multiplexer 20 to access selected odd or even data line 44, 46, such that data signal 34 is generated and synchronously provided by flip flop 55 as output signal DO'.

In particular during operation, at timing instances when RDNXT (high) signal 22 coincides with rising CLK edge, RPTR' signal 26, which may be a binary counter for toggling at each read, is received from read counter 12 for causing multiplexer 20 to select particular odd/even row address. Also, as before for other embodiments of the present invention, SEL signal 28 is shown as selecting either the current or next row address for data retrieval. In this alternate embodiment, access delay associated with selecting multiplexer 20 is avoided by synchronously generating output signal 35 upon receiving CLK signal 24.

I claim:

1. Electronic storage apparatus comprising:
   a storage circuit comprising a first cell having a first address and a second cell having a second address, the addresses being consecutive; and
   a selector circuit having a first input for receiving a clock signal applied thereto, having second and third inputs coupled to the first and second cells separately through first and second data lines respectively for reading data selectably from either cell, having a first output coupled to the storage circuit for providing the first address in response to first and second applications of the clock signal and for providing the second address in response to second and third applications of the clock signal, and having a second output for providing the read data from the first data line in response to the second application of the clock signal and for providing the read data from the second data line in response to the third application of the clock signal.

2. The apparatus of claim 1 wherein:
   the storage circuit comprises a first-in/first-out (FIFO) circuit, the first cell comprising a first register of the FIFO circuit having the first address, the second cell comprising a second register of the FIFO Circuit having the second address, the selector circuit comprising a multiplexer coupled to the FIFO circuit.

3. The apparatus of claim 2 wherein:
   the multiplexer is coupled to the first and second registers respectively through first and second buffers which are coupled to the first and second data lines.

4. The apparatus of claim 3 wherein:
   the buffers are tri-statable, such that when the buffers are enabled to couple the multiplexer to the registers, the multiplexer selects either register to generate a data signal therefrom.

5. The apparatus of claim 2 wherein:
   the FIFO circuit comprises a first bank including a plurality of registers having even row addresses and a second bank including a plurality of registers having odd row addresses, the first register being included in the first bank, the second register being included in the second bank.

6. The apparatus of claim 1 wherein:
   the storage circuit comprises a burst-mode memory circuit.

7. The apparatus of claim 1 wherein:
   the storage circuit further comprises a third cell having a third address and a fourth cell having a fourth address; the first, second, third and fourth addresses being consecutive; the selector circuit having fourth and fifth inputs coupled separately to the third and fourth cells through third and fourth data lines respectively for reading data selectably from the third or fourth cell, the first output providing the third address in response to third and fourth applications of the clock signal and providing the fourth address in response to fourth and fifth applications of the clock signal, the second output providing the read data from the third data line in response to the fourth application of the clock signal and providing the read data from the fourth data line to the fifth application of the clock signal.

8. The apparatus of claim 1 wherein:
   the selector circuit receives a read signal, such that a selected cell in the storage circuit is read by the selector circuit, and a data signal is thereby generated.

9. The apparatus of claim 8 wherein:
   the selector circuit comprises a counter and a decoder, the counter receiving the read signal and generating a count signal, the decoder receiving the count signal and generating an active signal applicable to the storage circuit for accessing a particular address of the selected cell.

10. The apparatus of claim 9 wherein:
    the count signal is generated by the counter according to a specified code.

11. The apparatus of claim 8 wherein:
    the selector circuit comprises a multiplexer coupled to the first and second cells through the first and second data lines respectively, the multiplexer generating the data signal.

12. Electronic storage apparatus comprising:
    a first-in/first-out (FIFO) circuit comprising a first register having a first row address and a second register having a second row address, the row addresses being consecutive; and
    a selector circuit comprising a multiplexer coupled separately to the first and second registers respectively through first and second data lines and first and second tri-statable buffers coupled respectively to the first and second data lines, for reading data selectably from either register in response to at least one of the first and second buffers being enabled to couple the multiplexer to at least one register, the multiplexer receiving a select signal and accessing a selected register to generate a data signal therefrom; the selector circuit further comprising a counter and a decoder, the counter receiving a read signal and generating a count signal according to a specified code, the decoder receiving the count signal and generating an active signal for application to the FIFO circuit for enabling access to a particular row address of a register other than the selected register.

13. The apparatus of claim 12 wherein:
    the FIFO circuit further comprises a third register having a third row address and a fourth register having a fourth row address; the first, second, third and fourth row addresses being consecutive; the multiplexer being coupled separately to the third and fourth registers through third and fourth data lines and third and fourth buffers coupled respectively to the third and fourth data lines, for reading data selectably from the third or fourth register.

14. A method for accessing data from a sequential-access memory device having a plurality of registers located at consecutively addressable rows, the method comprising the steps of:
    enabling, during a first cycle, first and second consecutive rows in the sequential-access memory device for accessing datum from a first register located at the first enabled row through a first data line, and for accessing datum from a second register located at the second enabled row through a second data line;

selecting, during the first cycle, the first data line to provide a data signal;

enabling, during a second cycle, the second row and a third consecutive row in the sequential-access memory device, for accessing datum from the second register through the second data line, and for accessing datum from a third register located at the third enabled row through a third data line; and selecting, during the second cycle, the second data line to provide a data signal.

15. The method of claim 14 further comprising the steps of:

receiving a read signal;

generating a count signal according to a specified code, in response to the read signal; and generating the addresses of the first, second, and third consecutive rows from the count signal.

16. Electronic storage apparatus comprising:

a storage circuit comprising a first cell having a first address and a second cell having a second address, the addresses being consecutive; and a selector circuit coupled to the first and second cells separately through first and second data lines respectively for reading data selectably from either cell in response to a read signal and for generating a data signal from the read data, the selector circuit comprising a toggle flip-flop for generating a select signal in response to the read signal and comprising a multiplexer coupled to the first and second cells separately through the first and second data lines, respectively, and coupled to the toggle flip-flop for receiving the select signal, and for selecting a data line in response to the select signal and for generating the data signal.

17. Electronic storage apparatus comprising:

a storage circuit comprising a first cell having a first address and a second cell having a second address, the addresses being consecutive; and a selector circuit coupled to the first and second cells separately through first and second data lines respectively for reading data selectably from either cell, in response to a read signal, and for generating a data signal, the selector circuit comprising an exclusive-OR circuit for generating a select signal in response to the read signal and a count signal, comprising a multiplexer coupled to the exclusive-OR circuit for receiving the select signal and coupled to the first and second cells through the first and second data lines, respectively, for selecting a particular data line in response to the select signal and for generating the data signal, and comprising a flip-flop coupled to the multiplexer for receiving the data signal.

18. Electronic storage apparatus comprising:

a first-in/first-out (FIFO) circuit comprising a first register having a first row address and a second register having a second row address, the row addresses being consecutive; and a selector circuit comprising a multiplexer coupled separately to the first and second registers respectively through first and second data lines and first and second tri-statable buffers coupled respectively to the first and second data lines, for reading data selectably from either register; in response at least one of the first and second buffers being enabled to couple the multiplexer to at least one register, the multiplexer receiving a select signal and accessing a selected register by selecting a particular data line coupled thereto to generate a data signal therefrom; the selector circuit further comprising a counter, a decoder and a toggle flip-flop, the counter receiving a read signal and generating a count signal according to a specified code, the decoder receiving the count signal and generating an active signal for application to the FIFO circuit for enabling access to a particular row address of a register other than the selected register, the toggle flip-flop receiving the read signal and generating the select signal for application to the multiplexer.

19. Electronic storage apparatus comprising:

a first-in/first-out (FIFO) circuit comprising a first register having a first row address and a second register having a second row address, the row addresses being consecutive; and a selector circuit comprising a multiplexer coupled separately to the first and second registers respectively through first and second data lines and first and second tri-statable buffers coupled respectively to the first and second data lines, for reading data selectably from either register; in response to at least one of the first and second buffers being enabled to couple the multiplexer to at least one register, the multiplexer receiving a select signal and accessing a selected register by selecting a particular data line coupled thereto to generate a data signal therefrom; the selector circuit further comprising a counter, a decoder, an exclusive-OR circuit, and a flip-flop, the counter receiving a read signal and generating a count signal according to a specified code, the decoder receiving the count signal and generating an active signal for application to the FIFO circuit for enabling access to a particular row address of a register other than the selected register, the exclusive-OR circuit receiving the read signal and the count signal and generating the select signal for application to the multiplexer, the flip flop receiving the data signal generated by the multiplexer.

* * * * *